(12) United States Patent
Zhang

(10) Patent No.: US 10,690,965 B2
(45) Date of Patent: Jun. 23, 2020

(54) QUANTUM DOT DIAPHRAGM AND LIQUID CRYSTAL DISPLAY DEVICE

(71) Applicant: Wuhan China Star Optoelectronics Technology Co., Ltd., Wuhan, Hubei (CN)

(72) Inventor: Yanxue Zhang, Guangdon (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 14/778,210

(22) PCT Filed: May 14, 2015

(86) PCT No.: PCT/CN2015/078994
§ 371 (c)(1),
(2) Date: Dec. 1, 2016

(87) PCT Pub. No.: WO2016/176870
PCT Pub. Date: Nov. 10, 2016

(65) Prior Publication Data
US 2017/0219886 A1    Aug. 3, 2017

(30) Foreign Application Priority Data

May 5, 2015 (CN) .......................... 2015 1 0223177

(51) Int. Cl.
*G02F 1/13357* (2006.01)
*H01L 33/50* (2010.01)

(52) U.S. Cl.
CPC ........ *G02F 1/133621* (2013.01); *H01L 33/50* (2013.01); *G02F 2001/133614* (2013.01); *G02F 2202/36* (2013.01)

(58) Field of Classification Search
CPC ................ G02B 6/0023; G02B 6/0033; G02F 2001/133614; G02F 2202/36; H01L 33/50; C08K 3/32
See application file for complete search history.

(56) References Cited

U.S. PATENT DOCUMENTS

2011/0156575 A1    6/2011   Yu et al.
2012/0007131 A1*   1/2012   Ueno ..................... H01L 33/508
                                                               257/98
(Continued)

FOREIGN PATENT DOCUMENTS

CN    202511145    10/2012
CN    103680367    3/2014
(Continued)

OTHER PUBLICATIONS

Search Report and Written Opinion, dated Jan. 2, 2016, for International Application No. PCT/CN2015/078994.
(Continued)

*Primary Examiner* — Michael H Caley
*Assistant Examiner* — Jonathan Y Jung
(74) *Attorney, Agent, or Firm* — Leong C. Lei

(57) ABSTRACT

A quantum dot diaphragm is disclosed. The quantum dot diaphragm comprises a color gamut conversion region and a color gamut non-effective region surrounding the color gamut conversion region, wherein the color gamut non-effective region is provided with a quantum phosphor layer. According to the present disclosure, the color gamut non-effective region is provided with the quantum phosphor layer, so that the technical defect that an area of the diaphragm along the cutting line would become useless when the diaphragm is cut can be eliminated, and a color gamut conversion function of the quantum dot diaphragm can be further improved. The manufacturing procedure of the quantum dot diaphragm according to the present disclo- (Continued)

sure is simple. After the quantum dot diaphragm is cut, the color gamut non-effective region of the quantum dot diaphragm could be coated with the quantum phosphor, and then the quantum dot diaphragm needs to be assembled to the module product, so that the electronic products with high color gamut can be obtained.

9 Claims, 1 Drawing Sheet

(56) References Cited

U.S. PATENT DOCUMENTS

| | | | |
|---|---|---|---|
| 2012/0113672 A1 | 5/2012 | Dubrow et al. | |
| 2012/0154464 A1* | 6/2012 | Ninan | G09G 3/02 345/691 |
| 2014/0098515 A1* | 4/2014 | Pickett | G09F 13/20 362/23.13 |
| 2015/0062490 A1* | 3/2015 | Kwon | G02B 6/003 349/64 |
| 2015/0177560 A1* | 6/2015 | Weiss | B82Y 30/00 445/24 |
| 2015/0187987 A1* | 7/2015 | Sim | G02F 1/133602 257/98 |
| 2016/0259110 A1* | 9/2016 | Liu | G02B 6/0023 |
| 2017/0219758 A1* | 8/2017 | Jang | G02B 6/0023 |
| 2018/0081105 A1* | 3/2018 | Harada | F21S 2/00 |

FOREIGN PATENT DOCUMENTS

| | | |
|---|---|---|
| CN | 103698937 | 4/2014 |
| CN | 103791322 | 5/2014 |
| CN | 203658706 | 6/2014 |
| CN | 103917000 | 7/2014 |
| CN | 104067164 | 9/2014 |
| JP | 2004231736 | 8/2004 |
| TW | 201122653 | 7/2011 |

OTHER PUBLICATIONS

Ofice Action and Search Report, dated Mar. 24, 2017, for Chinese Patent Application No. 201510223177.2.

* cited by examiner

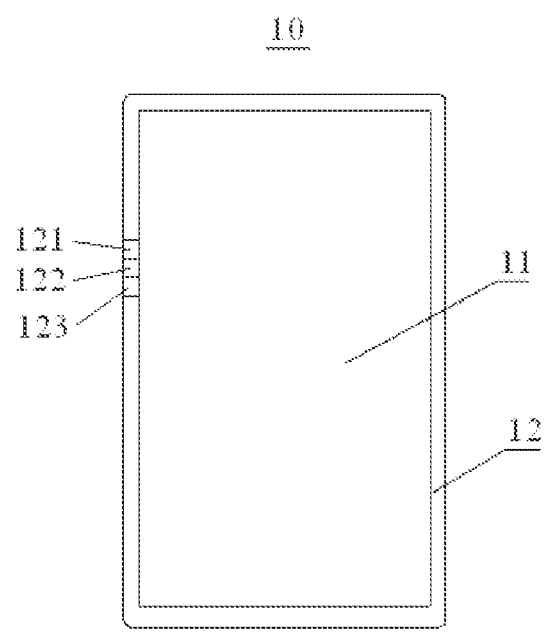

QUANTUM DOT DIAPHRAGM AND LIQUID CRYSTAL DISPLAY DEVICE

CROSS REFERENCE TO RELATED APPLICATION

The present application claims benefit of Chinese patent application CN 201510223177.2, entitled "Quantum Dot Diaphragm and Liquid Crystal Display Device" and filed on May 5, 2015, the entirety of which is incorporated herein by reference.

FIELD OF THE INVENTION

The present disclosure relates to the technical field of liquid crystal display, and particularly to a quantum dot diaphragm and a liquid crystal display device.

BACKGROUND OF THE INVENTION

With the development of electronic products, there is an increasingly high requirement for color gamut of the electronic products, and thus high color gamut design has become an important direction of electronic product design. At present, in the designing of high color gamut products, the color gamut conversion is generally realized by a quantum dot diaphragm which has a color gamut conversion function with a relatively high efficiency. However, when the diaphragm is cut, an area of the diaphragm along a cutting line thereof with a width about 1 mm would become useless. Consequently, with respect to mobile electronic products having a relatively narrow frame, the quantum dot diaphragm cannot be applied to these products satisfactorily.

In order to solve the aforesaid technical problem, a method through which the technical defect that an area of the diaphragm along the cutting line would become useless when the diaphragm is cut can be eliminated is needed, so that a better color gamut conversion function of the quantum dot diaphragm can be realized.

SUMMARY OF THE INVENTION

The present disclosure provides a quantum dot diaphragm in order to further improve a color gamut conversion function thereof.

The quantum dot diaphragm according to the present disclosure comprises a color gamut conversion region and a color gamut non-effective region surrounding the color gamut conversion region, wherein the color gamut non-effective region is provided with a quantum phosphor layer.

According to the present disclosure, the color gamut non-effective region is provided with the quantum phosphor layer, so that the technical defect that an area of the diaphragm along the cutting line would become useless when the diaphragm is cut can be eliminated, and a color gamut conversion function of the quantum dot diaphragm can be further improved. The manufacturing procedure of the quantum dot diaphragm according to the present disclosure is simple. After the quantum dot diaphragm is cut, the color gamut non-effective region of the quantum dot diaphragm could be coated with the quantum phosphor, and then the quantum dot diaphragm needs to be assembled to the module product, so that the electronic products with high color gamut can be obtained. It can be understood that, according to the present disclosure, the whole quantum dot diaphragm can be coated with the quantum phosphor layer. However, the whole quantum dot diaphragm being coated with the quantum phosphor layer is not cost-efficient since the quantum phosphor is relatively expensive.

According to some embodiments, an outside surface of the color gamut conversion region is flush with an outside surface of the color gamut non-effective region which is provided with the quantum phosphor layer. The flatness of an outside surface of the whole quantum dot diaphragm can be fully guaranteed with this arrangement, so that the quantum dot diaphragm can have a same thickness in each region thereof, and the color gamut conversion function of the quantum dot diaphragm can be further improved.

According to some embodiments, the quantum phosphor layer comprises a variety of quantum dots that can convert light received into light with different colors, which forms white light after mixture thereof. The color gamut conversion function can be realized by the quantum phosphor layer. The light that is emitted by a light source can be converted into the light with different colors by the quantum phosphor layer, and the light with different colors can form white light with a higher color gamut after mixture thereof.

According to some embodiments, the quantum phosphor layer comprises a plurality of transparent regions through which blue light can transmit, and a plurality of first quantum dot regions and second quantum dot regions which can at least be excited by the blue light and emit red light and green light respectively. According to one implementation, the blue light can be emitted by the light source. When the blue light irradiates the quantum phosphor layer, it can transmit directly through the transparent regions. At the same time, the first quantum dot regions and the second quantum dot regions can be excited by the blue light and then emit red light and green light respectively. The red light and the green light can mix with the blue light which transmits through the transparent regions so as to form the white light with a higher color gamut.

According to some embodiments, the transparent regions, the first quantum dot regions, and the second quantum dot regions are arranged in the color gamut non-effective region in an alternate manner. The aforesaid regions each can be arranged in the color gamut non-effective region conveniently with this disposition, and the light which exits from the color gamut non-effective region can become more uniform. Preferably, the transparent regions, the first quantum dot regions, and the second quantum dot regions each have a strip shape, and strip widths thereof can be selected with a certain ratio thereamong according to actual needs.

According to some embodiments, the transparent regions, the first quantum dot regions, and the second quantum dot regions each have a same light transmission area. With this arrangement, the light which exits from the transparent regions, the light which exits from the first quantum dot regions, and the light which exits from the second quantum dot regions share a same proportion, and thus the light exiting therefrom can become more uniform.

According to some embodiments, the quantum dot diaphragm is provided with a protection layer on an outside surface thereof. On the one hand, the flatness of the surface of the quantum dot diaphragm can be improved by the protection layer. On the other hand, the quantum dot diaphragm can be well protected by the protection layer, so that the color gamut conversion function thereof can be realized.

The present disclosure further provides a liquid crystal display device which comprises the aforesaid quantum dot diaphragm. In the liquid crystal display device with the aforesaid quantum dot diaphragm, a higher color gamut can be realized since the quantum dot diaphragm has a good color gamut conversion function.

According to some embodiments, the liquid crystal display device further comprises a backlight module and a liquid crystal panel, wherein the quantum dot diaphragm is arranged between the backlight module and the liquid crystal panel.

Compared with the prior art, the following advantages can be brought about according to the present disclosure.

1) The quantum dot diaphragm according to the present disclosure has a full color gamut conversion function. That is, the technical defect that an area of the diaphragm along the cutting line would become useless when the diaphragm is cut can be eliminated through arranging the quantum phosphor layer in the color gamut non-effective region and designing the quantum phosphor layer appropriately.

2) The manufacturing procedure of the quantum dot diaphragm according to the present disclosure is simple. After the quantum dot diaphragm is cut, the color gamut non-effective region thereof needs to be coated with the quantum phosphor simply, so that the quantum dot diaphragm is manufactured.

3) The quantum dot diaphragm according to the present disclosure can be applied to a variety of liquid crystal display devices, so that a high color gamut design of the variety of liquid crystal display devices can be realized.

BRIEF DESCRIPTION OF THE DRAWINGS

The present disclosure will be illustrated in detail hereinafter with reference to the embodiments and the drawings. In the drawing:

FIG. 1 schematically shows a structure of a quantum dot diaphragm according to the present disclosure.

In the drawings, a same component is represented by a same reference sign. The drawings are not drawn according to actual scale.

DETAILED DESCRIPTION OF THE EMBODIMENTS

The present disclosure will be further illustrated hereinafter with reference to the drawings.

The details described herein are only specific examples used for discussing the implementations of the present disclosure. The most useful and most understandable description on the principle and concept of the present disclosure is provided. The structural details which go beyond the scope of basic understanding of the present disclosure are not provided herein. Therefore, those skilled in the art can clearly understand, based on the description and the accompanying drawings, how to implement the present disclosure in different ways.

FIG. 1 schematically shows a structure of a quantum dot diaphragm 10 according to the present disclosure. The quantum dot diaphragm 10 comprises a color gamut conversion region 11 and a color gamut non-effective region 12 surrounding the color gamut conversion region 11, wherein the color gamut non-effective region 12 is provided with a quantum phosphor layer (the quantum phosphor layer is not shown in FIG. 1).

According to the present disclosure, the color gamut non-effective region 12 is provided with the quantum phosphor layer, so that the technical defect that an area of the diaphragm along the cutting line would become useless when the diaphragm is cut can be eliminated, and a color gamut conversion function of the quantum dot diaphragm 10 can be further improved. The manufacturing procedure of the quantum dot diaphragm 10 according to the present disclosure is simple. After the quantum dot diaphragm 10 is cut, the color gamut non-effective region 12 of the quantum dot diaphragm 10 could be coated with the quantum phosphor, and then the quantum dot diaphragm 10 needs to be assembled to the module product, so that the electronic products with high color gamut can be obtained. It can be understood that, according to the present disclosure, the whole quantum dot diaphragm 10 can be coated with the quantum phosphor layer. However, the whole quantum dot diaphragm 10 being coated with the quantum phosphor layer is not cost-efficient since the quantum phosphor is relatively expensive.

Preferably, an outside surface of the color gamut conversion region 11 is on a level with an outside surface of the color gamut non-effective region 12 which is provided with the quantum phosphor layer. The flatness of an outside surface of the whole quantum dot diaphragm 10 can be fully guaranteed with this arrangement, so that the quantum dot diaphragm 10 can have a same thickness in each region thereof, and the color gamut conversion function of the quantum dot diaphragm can be further improved.

According to the present disclosure, the quantum phosphor layer comprises a variety of quantum dots that can convert light received into light with different colors, which forms white light after mixture thereof. The color gamut conversion function can be realized by the quantum phosphor layer. The light that is emitted by a light source can be converted into the light with different colors by the quantum phosphor layer, and the light with different colors can form white light with a higher color gamut after mixture thereof.

According to the embodiment as shown in FIG. 1, the quantum phosphor layer comprises a plurality of transparent regions 121 through which blue light can transmit, and a plurality of first quantum dot regions 122 and second quantum dot regions 123 which can at least be excited by the blue light and emit red light and green light respectively. According to the present embodiment, the blue light can be emitted by the light source. When the blue light irradiates the quantum phosphor layer, it can transmit directly through the transparent regions 121. At the same time, the first quantum dot regions 122 and the second quantum dot regions 123 can be excited by the blue light and then emit red light and green light respectively. The red light and the green light can mix with the blue light which transmits through the transparent regions 121 so as to form the white light with a higher color gamut.

Preferably, as shown in FIG. 1, the transparent regions 121, the first quantum dot regions 122, and the second quantum dot regions 123 are arranged in the color gamut non-effective region 12 alternately. The aforesaid regions each can be arranged in the color gamut non-effective region 12 conveniently with this disposition, and the light which exits from the color gamut non-effective region 12 can become more uniform. Preferably, the transparent regions 121, the first quantum dot regions 122, and the second quantum dot regions 123 each have a strip shape, and strip widths thereof can be selected with a certain ratio thereamong according to actual needs.

More preferably, the transparent regions 121, the first quantum dot regions 122, and the second quantum dot regions 123 each have a same light transmission area. With this arrangement, the light which exits from the transparent regions 121, the light which exits from the first quantum dot regions 122, and the light which exits from the second quantum dot regions 123 share a same proportion, and thus the light exiting therefrom can become more uniform.

Moreover, the quantum dot diaphragm 10 according to the present disclosure is provided with a protection layer on an outside surface thereof. On the one hand, the flatness of the surface of the quantum dot diaphragm 10 can be improved by the protection layer. On the other hand, the quantum dot diaphragm 10 can be well protected by the protection layer, so that the color gamut conversion function thereof can be realized.

The present disclosure further provides a liquid crystal display device which comprises the aforesaid quantum dot diaphragm. In the liquid crystal display device with the aforesaid quantum dot diaphragm, a higher color gamut can be realized since the quantum dot diaphragm has a good color gamut conversion function. The quantum dot diaphragm according to the present disclosure can be applied to a variety of liquid crystal display devices, so that a high color gamut design of the variety of liquid crystal display devices can be realized. The quantum dot diaphragm is preferably arranged between a backlight module and a liquid crystal panel.

The quantum dot diaphragm according to the present disclosure has a full color gamut conversion function, and the manufacturing procedure thereof is simple. Therefore, the quantum dot diaphragm can be widely used in a variety of display products.

It should be noted that, the above embodiments are described only for better understanding, rather than restricting the present disclosure. Those skilled in the art can make amendments to the present disclosure within the scope as defined in the claims and without departing from the spirit and scope of the present disclosure. The present disclosure is described according to specific methods, materials, and implementations, but the present disclosure is not restricted by the details disclosed herein. On the contrary, the present disclosure is applicable for the equivalent structures, methods, and applications with the same functions as those defined in the claims.

The invention claimed is:

1. A method for preparing a quantum dot diaphragm, wherein the quantum dot diaphragm comprises a color gamut conversion region and a color gamut non-effective region surrounding the color gamut conversion region, and the quantum dot diaphragm comprises a cutting line along which a cut area of the quantum dot diaphragm extends to define said color gamut non-effective region that is of a predetermined width located between the cutting line and the color gamut conversion region, such that a function of color gamut conversion of the quantum dot diaphragm is maintained in the color gamut conversion region, while the function of color gamut conversion of the quantum dot diaphragm is lost in the color gamut non-effective region, the method comprising:
providing a quantum dot diaphragm and subjecting the quantum dot diaphragm to cutting to form the cutting line on the quantum dot diaphragm and to form the cut area on the quantum dot diaphragm along the cutting line, so as to define the color gamut conversion region and the color gamut non-effective region of the quantum dot diaphragm; and
subjecting the quantum dot diaphragm that is subjected to the cutting and includes the cut area to coating of a quantum phosphor layer on the cut area, wherein the quantum phosphor layer comprises a plurality of transparent regions that are transmittable to blue light and a plurality of first quantum dot regions and second quantum dot regions that are excitable by blue light to emit red light and green light, respectively, to provide the color gamut non-effective region with a supplementing function of color gamut conversion such that color gamut conversion is achievable in both the color gamut conversion region and the color gamut non-effective region, wherein the transparent regions, the first quantum dot regions, and the second quantum dot regions are arranged on the surface of the cut area in an alternate manner and are located between the cutting line and the color gamut conversion region, the transparent regions, the first quantum dot regions, and the second quantum dot regions being distributed along the cutting line.

2. The method for preparing the quantum dot diaphragm according to claim 1, wherein the color gamut non-effective region surrounds the color gamut conversion region, and the quantum phosphor layer that is coated on the surface of cut area is distributed along the color gamut non-effective region to surround the color gamut conversion region.

3. The method for preparing the quantum dot diaphragm according to claim 1, wherein the quantum phosphor layer comprises a variety of quantum dots that can convert light received therein into light with different colors, which forms white light after mixture.

4. The method for preparing the quantum dot diaphragm according to claim 2, wherein the quantum phosphor layer comprises a variety of quantum dots that can convert light received therein into light with different colors, which forms white light after mixture.

5. The method for preparing the quantum dot diaphragm according to claim 1, wherein the transparent regions, the first quantum dot regions, and the second quantum dot regions each have a strip shape.

6. The method for preparing the quantum dot diaphragm according to claim 1, wherein the transparent regions, the first quantum dot regions, and the second quantum dot regions each have a same light transmission area.

7. The method for preparing the quantum dot diaphragm according to claim 1, wherein the quantum dot diaphragm is provided with a protection layer on an outside surface thereof.

8. The method for preparing the quantum dot diaphragm according to claim 2, wherein the quantum dot diaphragm is provided with a protection layer on an outside surface thereof.

9. The method for preparing the quantum dot diaphragm according to claim 1, wherein an outside surface of the color gamut conversion region is flush with an outside surface of the quantum phosphor layer coated on the cut area of the color gamut non-effective region.

* * * * *